(12) United States Patent
Huang et al.

(10) Patent No.: US 12,471,218 B2
(45) Date of Patent: Nov. 11, 2025

(54) SANDWICH STRUCTURE POWER SUPPLY MODULE

(71) Applicant: Monolithic Power Systems, Inc., San Jose, CA (US)

(72) Inventors: Daocheng Huang, Santa Clara, CA (US); Zhao Yuan, San Jose, CA (US); Yishi Su, Hangzhou (CN); Wenyang Huang, Hangzhou (CN); Xintong Lyu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 842 days.

(21) Appl. No.: 17/589,277

(22) Filed: Jan. 31, 2022

(65) Prior Publication Data

US 2022/0295639 A1    Sep. 15, 2022

Related U.S. Application Data

(63) Continuation-in-part of application No. 17/197,394, filed on Mar. 10, 2021, now Pat. No. 12,309,929.

(51) Int. Cl.
*H01F 27/28* (2006.01)
*H01F 27/24* (2006.01)
(Continued)

(52) U.S. Cl.
CPC ............ *H05K 1/181* (2013.01); *H01F 27/24* (2013.01); *H01F 27/28* (2013.01); *H05K 1/111* (2013.01);
(Continued)

(58) Field of Classification Search
CPC .......... H05K 1/181; H05K 1/111; H05K 1/14; H05K 2201/1003; H05K 2201/10378;
(Continued)

(56) References Cited

U.S. PATENT DOCUMENTS 8,064,202 B2   11/2011   Yin et al.
8,604,597 B2   12/2013   Jiang
(Continued)

FOREIGN PATENT DOCUMENTS

CN   203289736 U   11/2013
CN   207074591 U    3/2018
(Continued)

OTHER PUBLICATIONS

U.S. Appl. No. 17/197,394, filed Mar. 10, 2021, Monolithic Power Systems Inc.

*Primary Examiner* — Mang Tin Bik Lian
(74) *Attorney, Agent, or Firm* — Perkins Coie LLP

(57) ABSTRACT

A sandwich structure power supply module, having: an inductor pack having at least one inductor; a top PCB (Printed Circuit Board) on top of the inductor pack; and at least one power device chip on top of the top PCB, wherein each one of the power device chips has at least one pin connected to an associated inductor via the top PCB; wherein the inductor pack is wrapped with metal layers, wherein each two metal layers are lied against to a same surface of the inductor pack, with an isolation layer in between, and wherein the two metal layers are connected to different potentials.

5 Claims, 12 Drawing Sheets

(51) Int. Cl.
*H05K 1/11* (2006.01)
*H05K 1/14* (2006.01)
*H05K 1/18* (2006.01)

(52) U.S. Cl.
CPC ....... *H05K 1/14* (2013.01); *H05K 2201/1003* (2013.01)

(58) Field of Classification Search
CPC ........ H05K 1/145; H05K 7/023; H01F 27/24; H01F 27/28; H01F 27/2847; H01F 27/292; H01F 27/306; H01F 27/26; H01F 27/266; H01F 27/2885
See application file for complete search history.

(56) References Cited

U.S. PATENT DOCUMENTS

| | | | |
|---|---|---|---|
| 8,742,490 | B2 | 6/2014 | Disney |
| 9,263,177 | B1 | 2/2016 | Ikriannikov et al. |
| 11,398,333 | B2 | 7/2022 | Huang et al. |
| 11,682,515 | B2 | 6/2023 | Huang et al. |
| 2005/0184372 | A1 | 8/2005 | Asahi et al. |
| 2010/0176909 | A1 | 7/2010 | Yasuda et al. |
| 2012/0056703 | A1 | 3/2012 | Ikriannikov |
| 2012/0193772 | A1 | 8/2012 | Jiang |
| 2018/0122562 | A1* | 5/2018 | Ji ........................... H05K 1/181 |
| 2018/0330870 | A1 | 11/2018 | Sakai et al. |
| 2018/0366256 | A1 | 12/2018 | Kuo et al. |
| 2019/0108939 | A1* | 4/2019 | Fujimoto ................ H02M 1/14 |
| 2019/0295765 | A1 | 9/2019 | Yan et al. |
| 2020/0113058 | A1* | 4/2020 | Xiong ................... H05K 1/186 |
| 2020/0312766 | A1 | 10/2020 | Bhagavat et al. |
| 2021/0274656 | A1* | 9/2021 | Xiong ................... H05K 3/3494 |
| 2022/0254563 | A1* | 8/2022 | Yan ....................... H01F 27/292 |
| 2022/0285075 | A1* | 9/2022 | Zhang .................... H01F 27/24 |
| 2022/0295635 | A1 | 9/2022 | Huang et al. |
| 2022/0295638 | A1 | 9/2022 | Huang et al. |
| 2022/0369464 | A1 | 11/2022 | Huang et al. |
| 2023/0269877 | A1 | 8/2023 | Huang et al. |
| 2023/0396158 | A1 | 12/2023 | Huang et al. |

FOREIGN PATENT DOCUMENTS

| | | |
|---|---|---|
| CN | 207074596 U | 3/2018 |
| CN | 207149384 U | 3/2018 |
| CN | 108022917 A | 5/2018 |
| CN | 111313655 A | 6/2020 |

\* cited by examiner

SANDWICH STRUCTURE POWER SUPPLY MODULE

CROSS-REFRENCE TO RELATED APPLICATIONS

This application is a continuation-in-part of U.S. patent application Ser. No. 17/197,394, filed Mar. 10, 2021, which is hereby incorporated by reference in its entirety.

TECHNICAL FIELD

The present invention generally relates to electrical components, and more particularly but not exclusively relates to power supply modules.

BACKGROUND

Power converter, as known in the art, converts an input power to an output power for providing a load with required voltage and current. Multi-phase power converter comprising a plurality of paralleled power stages operating out of phase has lower output ripple voltage, better transient performance and lower ripple-current-rating requirements for input capacitors. They are widely used in high current and low voltage applications, such as server, microprocessor.

With the development of modern GPUs (Graphics Processing Units), and CPUs (Central Processing Units), increasingly high load current is required to achieve better processor performance. However, the size of microprocessor needs to become smaller. Higher current and smaller size put more challenges to the heat conduction. Therefore, high-power density and high-efficiency power converters with excellent heat dissipation path are necessary.

SUMMARY

It is an object of the present invention to provide a sandwich structure power supply module with inductors, power switches and drivers mounted and integrated in a small size power supply module.

The embodiments of the present invention are directed to a sandwich structure power supply module, comprising: an inductor pack having at least one inductor; a top PCB (Printed Circuit Board) on top of the inductor pack; and at least one power device chip on top of the top PCB, wherein each one of the at least one power device chip has at least one pin connected to an associated inductor via the top PCB; wherein the inductor pack is wrapped with metal layers, wherein each two metal layers are lied against to a same surface of the inductor pack, with an isolation layer in between, and wherein the two metal layers are connected to different potentials.

The embodiments of the present invention are directed to an inductor pack, comprising: a magnetic core having two passageways passing through the magnetic core from a top surface to a bottom surface; two windings respectively passing through the two passageways; and two pairs of metal layers, wherein each pair of the metal layer comprises two metal layers lie against to a same side surface of the inductor pack, with an isolation layer in between, and wherein the two metal layers of a pair of the metal layers are connected to different potentials.

The embodiments of the present invention are directed to an inductor pack, comprising: a magnetic core having two passageways passing through the magnetic core from top to bottom; two windings respectively passing through the two passageways; and a first metal layer and a second metal layer respectively lie against to opposite side surface of the magnetic core, and a third metal layer lies against to one of the remaining side surfaces.

The sandwich structure power supply module in the present invention: (1) could save PCB (Printed Circuit Board) footprint compared to the prior art tiled module structure, which improves load current/power density; (2) could minimize the output current trace impedance on PCB and mainly deliver output current through inductor legs to achieve high-efficiency; and (3) with the power device chips on top and inductor pack on bottom structure could largely benefit from the top-side cooling system which is normally adopted by GPU, CPU, ASIC (Application Specific Integrated Circuit) systems.

The inductor pack in the present invention: 1) takes the most advantage of inductor area and thus maximize the inductance value/saturation current; 2) adopts hybrid magnetic core materials to avoid the sharp drop of inductance value at high saturation current. Overall, the inductor pack in the present invention is designed to have low DCR, high inductance at low current for high efficiency, low inductance at high current for good transient performance, and external ground and power legs for high current return path.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Figure 1:
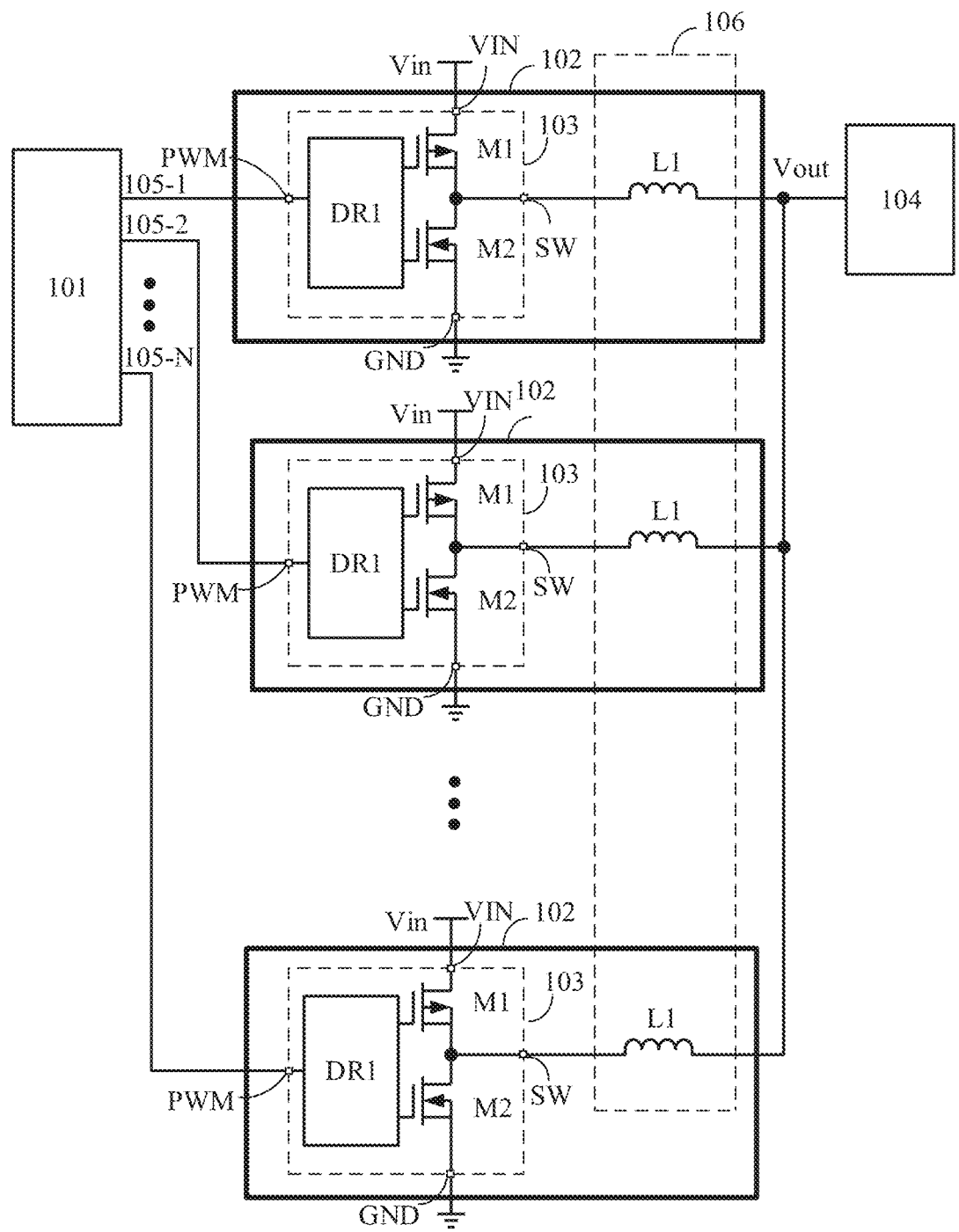
FIG. 1 schematically shows a prior art multi-phase power converter 10 which comprises a controller 101, N power devices 103 and N inductors L1 for supplying power to a load 104.

In the present disclosure, numerous specific details are provided, such as examples of electrical circuits and components, to provide a thorough understanding of embodiments of the invention. Persons of ordinary skill in the art will recognize, however, that the invention can be practiced without one or more of the specific details. It is noted that, for purposes of illustrative clarity, certain elements in the drawings may not be drawn to scale. In other instances, well-known details are not shown or described to avoid obscuring aspects of the invention.

FIG. 1 schematically shows a multi-phase power converter 10 which comprises a controller 101, N power devices 103 and N inductors L1 for supplying power to a load 104, wherein N is an integer, and N>1. Each power device 103 and one inductor L1 represent one power stage, i.e., one phase 102 of the power converter 10, as shown in FIG. 1. Each power device 103 comprises power switches M1, M2 and a driver DR1 for driving the power switches M1 and M2. The controller 101 provides N phase control signals 105-1~105-N respectively to N power devices 103 to control the N phases 102 working out of phase, i.e., the inductors L1 sequentially absorb power from the input source and sequentially deliver power to the load 104. It should be noticed that the outputs of all phases as shown in FIG. 1 are connected to work as a multi-phase converter. However, each phase output may be separated to work as multiple independent converters which could have different output voltage levels for different load demands.

The power stage 102 with Buck topology is shown in FIG. 1 for example. Persons of ordinary skill in the art should appreciate that power stages with other topologies, like Boost topology, Buck-Boost topology could also be adopted in a multi-phase power converter.

The inductors L1 could be implemented by one or a few coupled inductors or could be implemented by N single inductors.

When N=2, the multi-phase power converter 10 is used as a dual-phase power converter or two separate single-phase converters.

Figure 2:
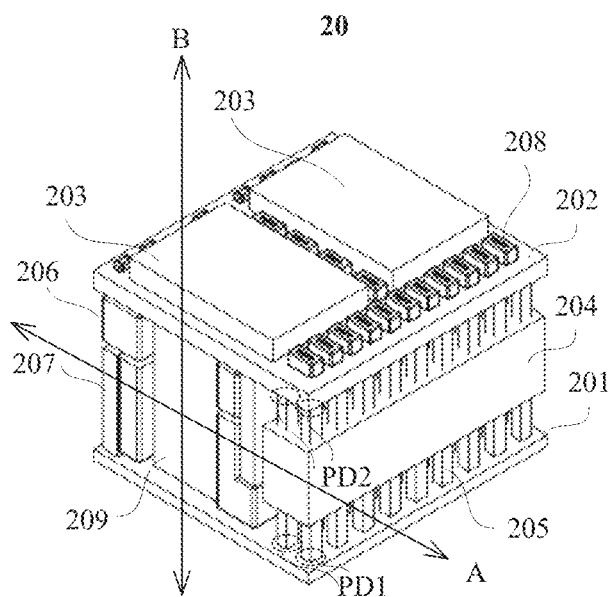
FIG. 2 shows a sandwich structure power supply module 20 for a dual-phase power converter in accordance with an embodiment of the present invention.

FIG. 2 shows a sandwich structure power supply module 20 for a dual-phase power converter in accordance with an embodiment of the present invention. The power supply module 20 may serve as the power stage 102 of FIG. 1, with N=2. The sandwich structure power supply module 20 comprises: a bottom PCB 201 at the bottom of the sandwich structure power supply module 20; an inductor pack 206 having two inductors located on the bottom PCB 201, wherein each inductor has a first end and a second end: a top PCB 202 on the top of the inductor pack 206; a connector 204 placed between the bottom PCB 201 and the top PCB 202, wherein the connector 204 has a plurality of metal pillars 205 respectively connecting solder pads PD1 on the bottom PCB 201 to solder pads PD2 on the top PCB 202; and two power device chips 203 on the top of the top PCB 202, wherein each one of the power device chips 203 has one or more than one pins (e.g., SW pin connected to the inductor L1 as shown in FIG. 1) electrically connected to the second end of one inductor of the inductor pack 206 via the top PCB 202; wherein each inductor comprises a winding 207 having ends folded to a plane perpendicular to an axis along a length of the winding 207.

In FIG. 2, the power supply module 20 further comprises the discrete components 208 located on the top PCB 202. The discrete components 208 comprise resistors and capacitors of the power converter 10, like the input capacitors at the input terminal to provide pulse current, the filter capacitors and resistors for driver and internal logic circuits power supplies, etc.

In one embodiment, the metal pillars 205 comprises copper pillars for soldering the bottom PCB 201 to the top PCB 202. Persons of ordinary skill in the art should appreciate that the metal pillars 205 could be made of any known material for soldering one PCB to another PCB.

The power supply module 20 is utilized to a mainboard to supply power to the devices on the mainboard. The bottom PCB 201 is soldered to the mainboard to connect the necessary pins of the power supply module 20 to the mainboard. In some embodiments, the bottom PCB 201 could be saved. The connector 204 and the inductor pack 206 are soldered to the mainboard directly.

In the present invention, the inductors and the power device chips are mounted to save the footprint on a PCB integrating the power converter 10 and the devices powered by the power converter 10. Each power device chip 203 integrates the power device 103 in FIG. 1, which comprises the power switches M1, M2, the driver DR1, and further integrates some auxiliary circuits not shown in FIG. 1. In one embodiment, each of the power device 103 includes a power pin VIN configured to receive the input voltage Vin, a pin SW configured to deliver power to the load 104 via the inductor L1, a pin PWM configured to receive the control signals (e.g., 105-1~105-N) from the controller 101, and a ground reference pin GND. The pins of the power device chips 203 are electrically connected to the solder pads on the bottom PCB 201 via the top PCB 202, the inductor pack 206 and the connector 204, to make sure that all the necessary signals could be obtained from the bottom PCB 201. Furthermore, for the signals with large current, like ground reference, the power supply module 20 provides metal layers 209. The metal layers 209 solders the top PCB 202 to the bottom PCB 201. The metal layer 209 coats part of a magnetic core of the inductor pack 206. The location of the metal layer 209 is determined by the location of ground reference pins of the power device chips 203. In the example of FIG. 2, since the metal layers 209 are placed at the side of the inductor pack 206, the ends of the metal layers 209 are bent to produce tabs close to the ground reference pins of the power device chips 203, so that to carry high current in the horizontal direction through metal tabs instead of PCB traces which lowers conduction loss and improve efficiency.

Figure 3:
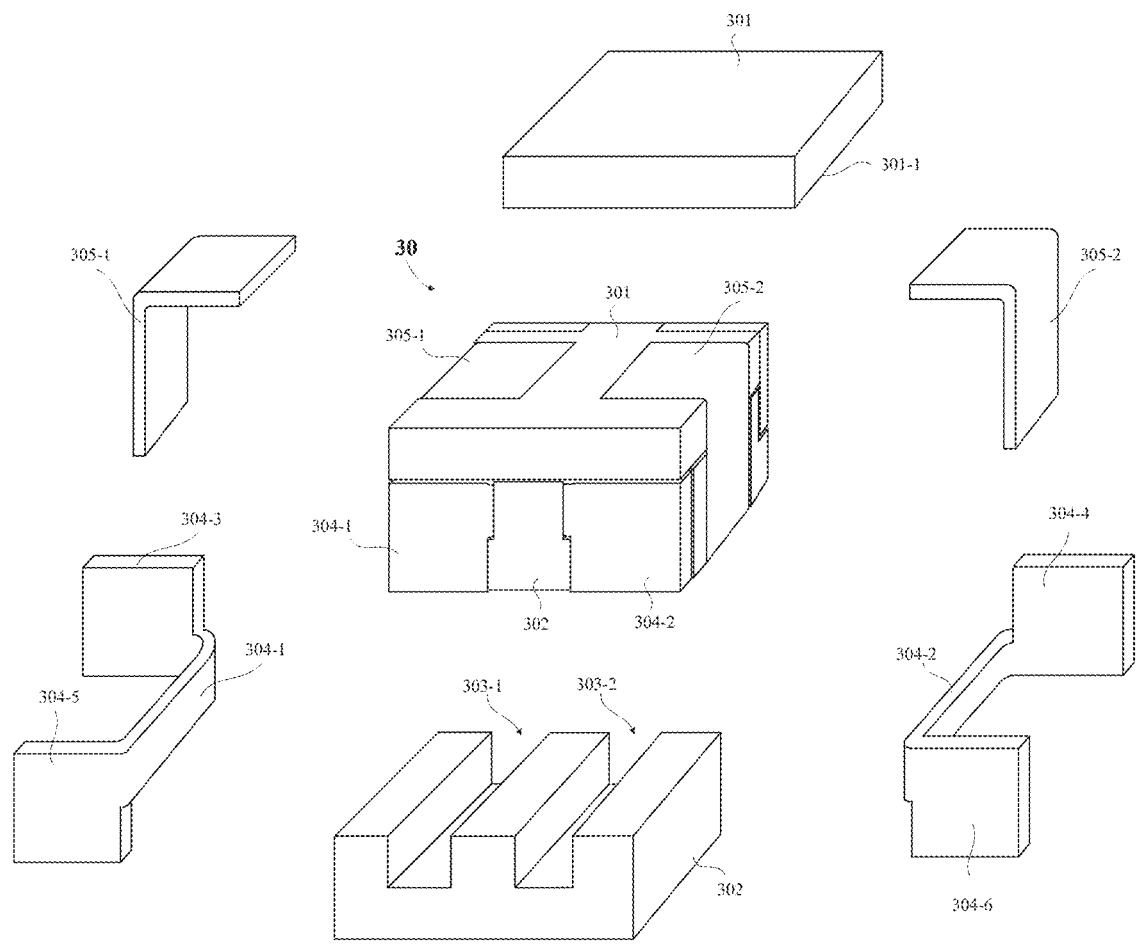
FIG. 3 shows the disassemble view of an inductor pack 30 in accordance with an embodiment of the present invention.

FIG. 3 shows the disassembled view of an inductor pack 30 in accordance with an embodiment of the present invention. The inductor pack 30 may serve as the inductor pack 206 in FIG. 2. As shown in FIG. 3, the inductor pack 30 comprises: a magnetic core having a first magnetic core part 301 and a second magnetic core part 302, wherein the first magnetic core part 301 and the second magnetic core part 302 are assembled to have two passageways 303-1 and 303-2 at a planer where the first magnetic core part 301 and the second magnetic core part 302 are aligned; and two windings 304-1 and 304-2 respectively passing through two passageways 303-1 and 303-2 between the first magnetic core part 301 and the second magnetic core part 302.

In the embodiment of FIG. 3, the passageways 303-1 and 303-2 have a depth along an axis A parallel to the bottom PCB 201 and the top PCB 202 shown in FIG. 2.

In the embodiment of FIG. 3, the winding 304-1 has a first end 304-3 bent 90 degrees to cover a surface of the magnetic core and extended along the top PCB 202 to be soldered to the top PCB 202, and a second end 304-5 bent 90 degrees to cover a surface of the magnetic core and extended along the bottom PCB 201 to be soldered to the bottom PCB 201, and wherein the first end 304-3 and the second end 304-5 of the winding 304-1 are extended at a plane perpendicular to an axis along the depth of the passageways 303-1 and 303-2 of the magnetic core. Similarly, the winding 304-2 has a first end 304-4 bent 90 degrees to cover a surface of the magnetic core and extended along the top PCB 202 to be soldered to the top PCB 202, and a second end 304-6 bent 90 degrees to cover a surface of the magnetic core and extended along the bottom PCB 201 to be soldered to the bottom PCB 201, and wherein the first end 304-4 and the second end 304-6 of the winding 304-2 are extended at a plane perpendicular to an axis along the depth of the passageways 303-1 and 303-2 of the magnetic core.

In the embodiment of FIG. 3, the magnetic core has a first magnetic core part 301 and a second magnetic core part 302 which are asymmetrical, wherein the first magnetic core part 301 is in a planar shape and the second magnetic core part 302 has two trenches, and wherein the passageways 303-1, 303-2 is respectively formed by a trench of the second magnetic core 302 and a surface 301-1 of the first magnetic core 301.

In the embodiment of FIG. 3, the metal layers 305-1 and 305-2 have a L-shape. The metal layers 305-1 and 305-2 are configured to solder the top PCB 202 to the bottom PCB 201. The ends of the metal layers 305-1 and 305-2 for soldering the top PCB 202 are bent 90 degrees and extended to produce tabs to be soldered to the ground reference pins of the power device chips 203 via the top PCB 202 with minimized PCB trace impedance inside the top PCB.

Figure 4:
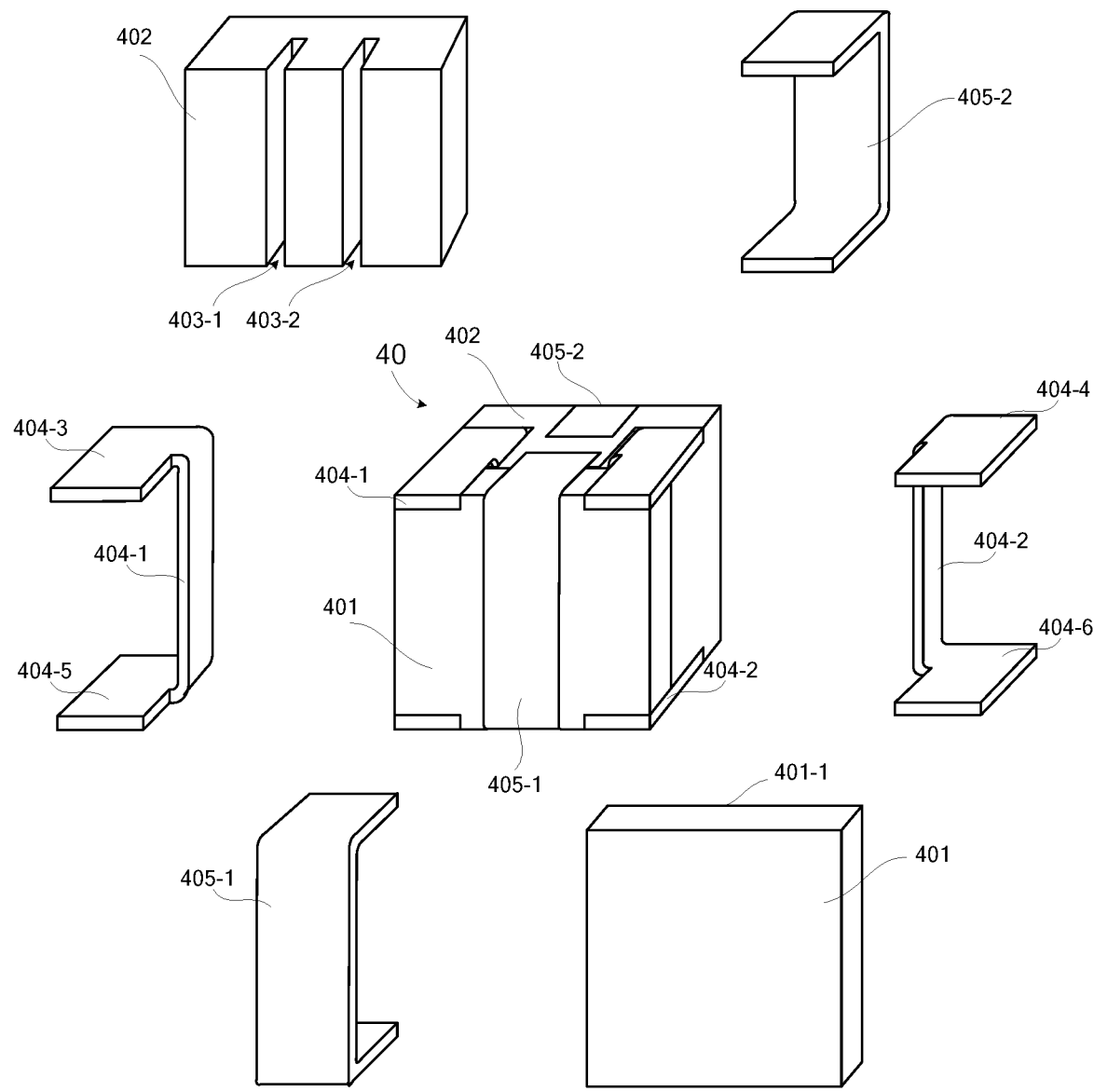
FIG. 4 shows the disassemble view of an inductor pack 40 in accordance with an embodiment of the present invention.

FIG. 4 shows the disassembled view of an inductor pack 40 in accordance with an embodiment of the present invention. The inductor pack 40 may serve as the inductor pack 206 in FIG. 2. As shown in FIG. 4, the inductor pack 40 comprises: a magnetic core having a first magnetic core part 401 and a second magnetic core part 402, wherein the first magnetic core part 401 and the second magnetic core part 402 are assembled to have two passageways 403-1 and 403-2 at a planer where the first magnetic core part 401 and the second magnetic core part 402 are aligned; and two windings 404-1 and 404-2 respectively passing through two passageways 403-1 and 403-2 between the first magnetic core part 401 and the second magnetic core part 402.

In the embodiment of FIG. 4, the passageways 403-1 and 403-2 have a depth along an axis B perpendicular to the bottom PCB 201 and the top PCB 202 if adopted by the power supply module 20 in FIG. 2.

In the embodiment of FIG. 4, the winding 404-1 has a first end 404-3 bent 90 degrees to cover a surface of the magnetic core and extended along a surface of the top PCB 202 to be soldered to the top PCB 202, and a second end 404-5 bent 90 degrees to cover a surface of the magnetic core and extended along a surface of the bottom PCB 201 to be soldered to the bottom PCB 201, and wherein the first end 404-3 and the second end 404-5 of the winding 404-1 are extended at a plane perpendicular to an axis along the depth of the passageways 403-1 and 403-2 of the magnetic core. Similarly, the winding 404-2 has a first end 404-4 bent 90 degrees to cover a surface of the magnetic core and extended along a surface of the top PCB 202 to be soldered to the top PCB 202, and a second end 404-6 bent 90 degrees to cover a surface of the magnetic core and extended along a surface of the bottom PCB 201 to be soldered to the bottom PCB 201, and wherein the first end 404-4 and the second end 404-6 of the winding 404-2 are extended at a plane perpendicular to an axis along the depth of the passageways 403-1 and 403-2 of the magnetic core.

In some embodiments, the second end 404-5 of the windings 404-1, and the second end 404-6 of the windings 404-2 are not bent. Whether the second ends of the winding are bent or not, and the locations, shapes of the second ends of the windings, are determined by the locations of the associated solder pads on the bottom PCB of the power supply module, or the associated solder pads on the mainboard if the bottom PCB is saved.

In the embodiment of FIG. 4, the magnetic core has a first magnetic core part 401 and a second magnetic core part 402 which are asymmetrical, wherein the first magnetic core part 401 is in a planar shape and the second magnetic core part 402 has two trenches, and wherein each of the passageways 403-1, 403-2 is respectively formed by a trench of the second magnetic core 402 and a surface 401-1 of the first magnetic core 401.

In the embodiment of FIG. 4, the metal layers 405-1 and 405-2 have a C-shape. The metal layers 405-1 and 405-2 are configured to solder the top PCB 202 to the bottom PCB 201. The ends of the metal layers 405-1 and 405-2 for soldering the bottom PCB 201 are bent 90 degrees and extended to produce tabs to be soldered to the bottom PCB 201 with minimized PCB trace impedance inside the bottom PCB 201. Also, the ends of the metal layers 405-1 and 405-2 for soldering the top PCB 202 are bent 90 degrees and extended to produce tabs to be soldered to the ground reference pins of the power device chips 203 via the top PCB 202 with minimized PCB trace impedance inside the top PCB 202.

Figure 5:
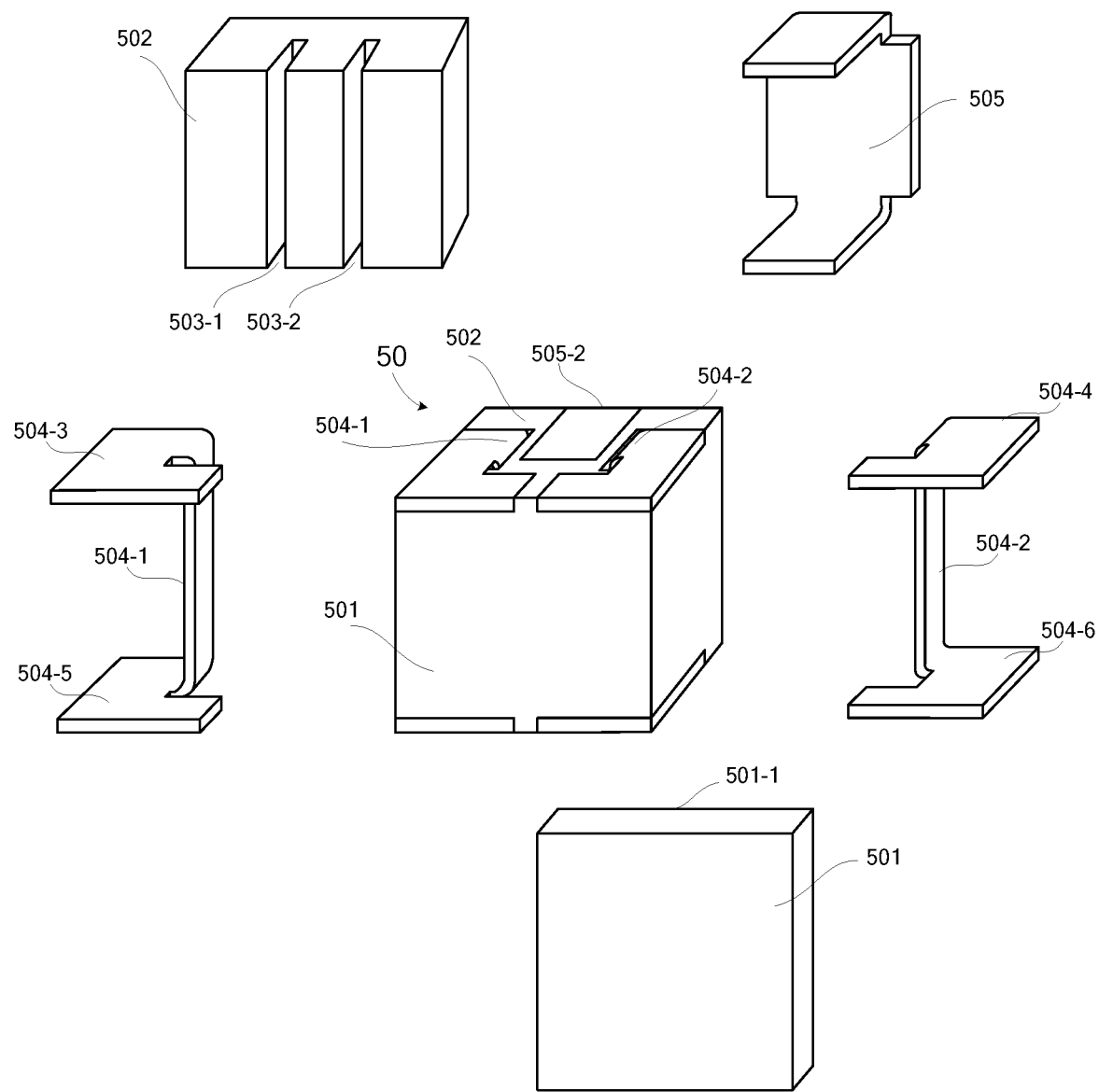
FIG. 5 shows the disassembled view of an inductor pack 50 in accordance with an embodiment of the present invention.

FIG. 5 shows the disassembled view of an inductor pack 50 in accordance with an embodiment of the present invention. The inductor pack 50 may serve as the inductor pack 206 in FIG. 2. As shown in FIG. 5, the inductor pack 50 comprises: a magnetic core having a first magnetic core part 501 and a second magnetic core part 502, wherein the first magnetic core part 501 and the second magnetic core part 502 are assembled to have two passageways 503-1 and 503-2 at a planer where the first magnetic core part 501 and the second magnetic core part 502 are aligned; and two windings 504-1 and 504-2 respectively passing through two passageways 503-1 and 503-2 between the first magnetic core part 501 and the second magnetic core part 502.

In the embodiment of FIG. 5, the passageways 503-1 and 503-2 have a depth along an axis B perpendicular to the bottom PCB 201 and the top PCB 202 if adopted by the power supply module 20 in FIG. 2.

In the embodiment of FIG. 5, the metal layer 505 has a C-shape. The metal layer 505 is configured to solder the top PCB 202 to the bottom PCB 201. The end of the metal layer 505 for soldering the bottom PCB 201 are bent 90 degrees and extended to produce tabs to be soldered to the bottom PCB 201 with minimized PCB trace impedance inside the bottom PCB 201. Also, the end of the metal layer 505 for soldering the top PCB 202 are bent 90 degrees and extended to produce tabs to be soldered to the ground reference pins of the power device chips 203 via the top PCB 202 with minimized PCB trace impedance inside the top PCB 202. In the example of FIG. 5, the middle part of the metal layer 505 are extended to both sides to lower the impedance of the metal layer 505.

Compared with the inductor pack 40 in FIG. 4, the inductor pack 50 in FIG. 5 has one metal layer 505 for soldering the ground reference pins from the top PCB 202 to the bottom PCB 201. Since the area for another ground metal layer as in FIG. 4 is saved, the ends of the windings in the embodiment of FIG. 5 extend to larger areas at the top and the bottom of the inductor pack 50, which makes the power device chips 203 have more flexibility to configure pins.

The magnetic core having a first magnetic core part 501 and a second magnetic core part 502 in the embodiment of FIG. 5 is similar to the magnetic core in the embodiment of FIG. 4, and is not described here for brevity.

Figure 6:
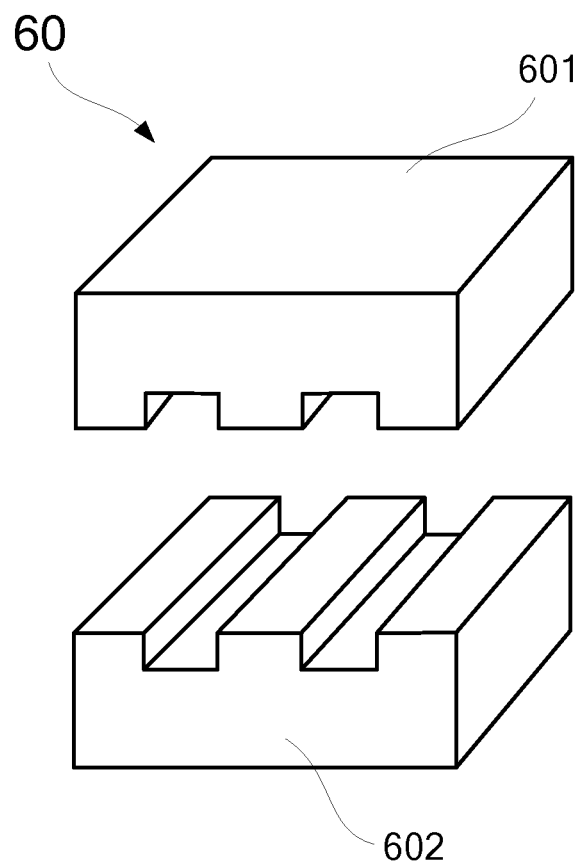
FIG. 6 shows a magnetic core 60 in accordance with an embodiment of the present invention.

FIG. 6 shows a magnetic core 60 in accordance with an embodiment of the present invention. In FIG. 6, the magnetic core 60 comprises a first magnetic core part 601 and a second magnetic core part 602 which are symmetrical, wherein each one of the magnetic core parts has two trenches. When the magnetic core 60 is adopted by the inductor pack 30 in FIG. 3, the inductor pack 40 in FIG. 4, or the inductor pack 50 in FIG. 5, each passageway for passing a winding is formed by a trench of the first magnetic core part 601 and a trench of the second magnetic core part 602.

Figure 7:
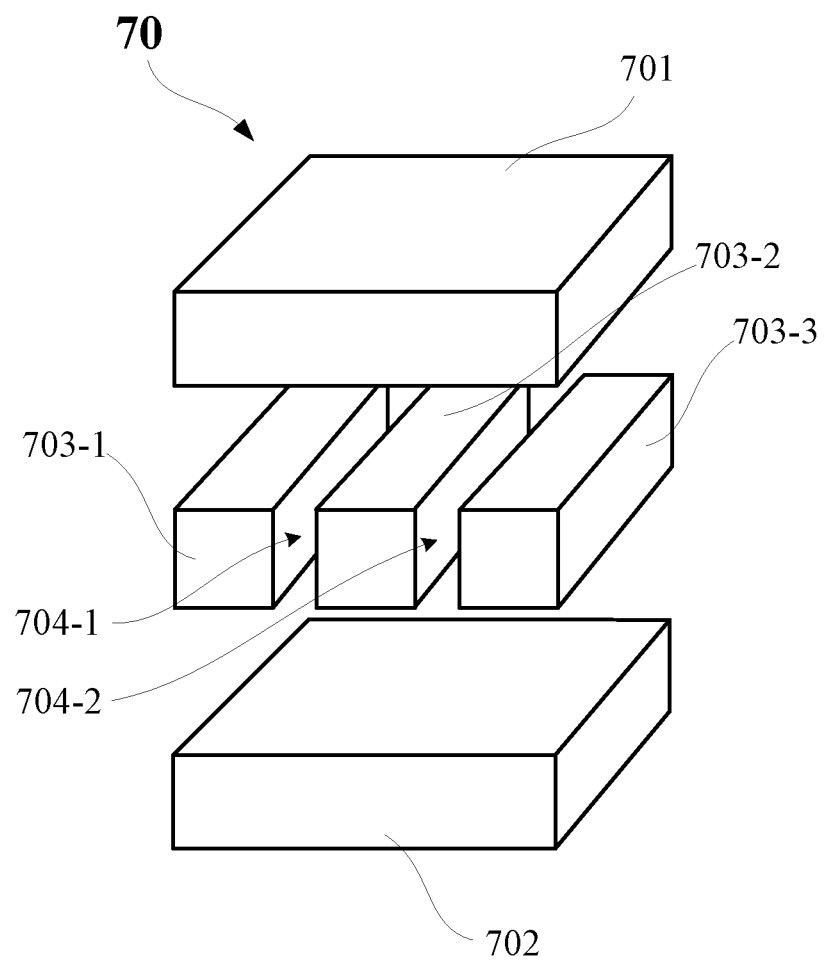
FIG. 7 shows a magnetic core 70 in accordance with an embodiment of the present invention.

FIG. 7 shows a magnetic core 70 in accordance with an embodiment of the present invention. In FIG. 7, the magnetic core 70 comprises a first magnetic core part 701, a second magnetic core part 702 and third magnetic core parts 703-1~703-3. The first magnetic core part 701, the second magnetic core part 702 and the third magnetic core parts 703-1 and 703-2 forms a passageway 704-1. The first magnetic core part 701, the second magnetic core part 702 and the third magnetic core parts 703-2 and 703-3 forms a passageway 704-2. More passageways could be formed when there are more third magnetic core parts. The first magnetic core part 701, the second magnetic core part 702 and the third magnetic core parts 703-1~703-3 could be made of different materials to provide a more flexible inductance-current curve.

In some embodiments of the present invention, the magnetic core parts of the magnetic core may be made of the same material, but have different geometries and/or percent composition to meet an inductance-current requirement of a target inductance profile, e.g., high inductance at low currents and low inductance at high currents. High inductance at low currents allows for higher efficiency, while low inductance at high currents allows for better transient response. In some embodiments, the magnetic core parts of the magnetic core may be made of different materials, like ferrite, iron powder, and any other suitable magnetic material to obtain a target inductance profile.

The inductor pack 30 in FIG. 3, the inductor pack 40 in FIG. 4 and the inductor pack 50 in FIG. 5 show magnetic cores with two windings respectively passing through two passageways of the magnetic cores for illustration. Persons of ordinary skill in the art should appreciate that the magnetic cores of the present invention could have any number of passageways and the corresponding windings according to the application requirement, like, one, or more than two.

In some embodiments, a gap may exist between the magnetic core parts of the magnetic core to form a coupled inductor. In some embodiments, independent inductors are formed with no gap between the magnetic core parts.

In the present invention, to make the inductor packs have planar surfaces, the windings and the metal layers that cover the surfaces of the magnetic cores are damascened into the magnetic core surfaces as shown in FIGS. 3 and 4.

Figure 8:
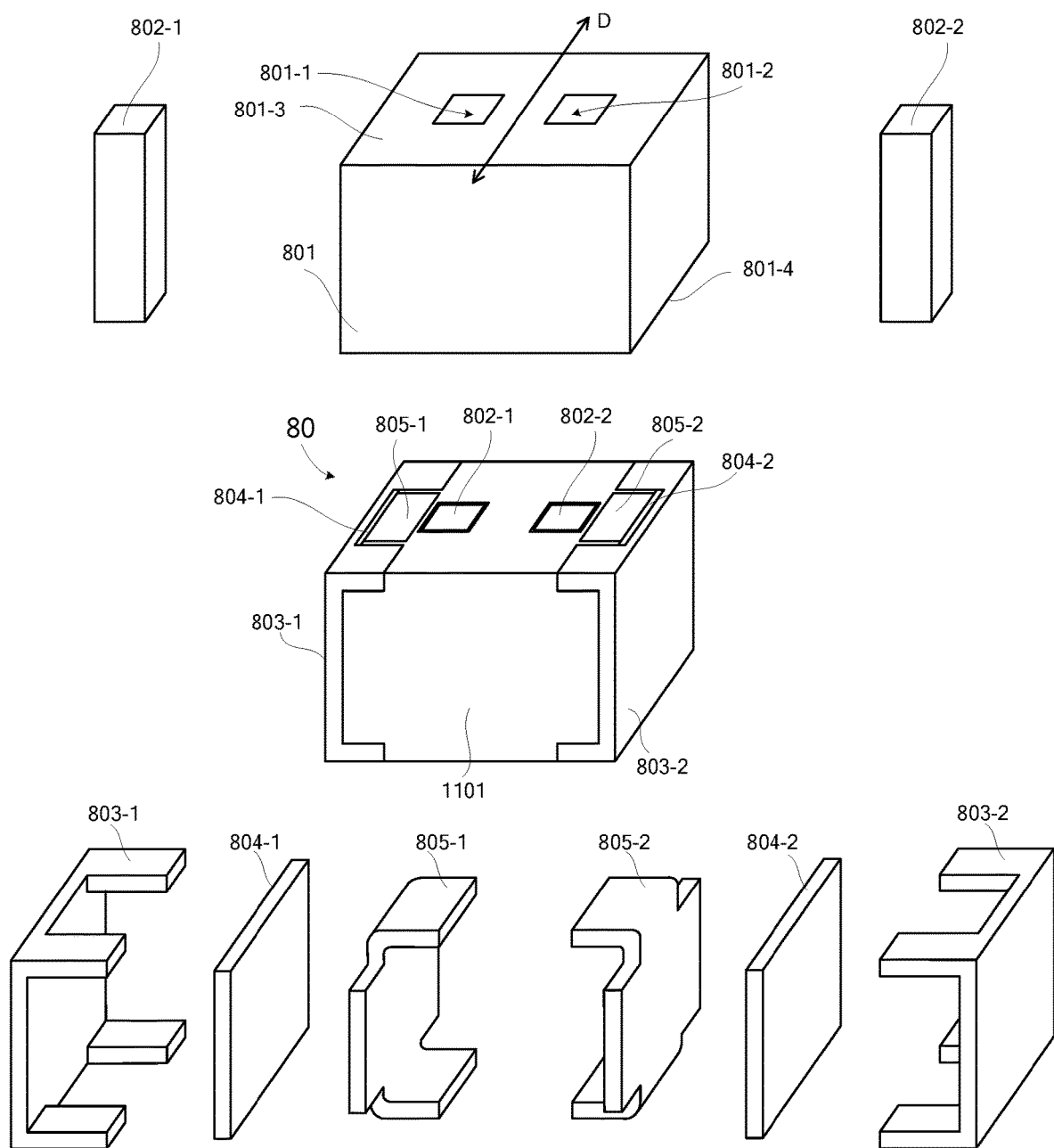
FIG. 8 shows the disassemble view of an inductor pack 80 in accordance with an embodiment of the present invention.

FIG. 8 shows the disassembled view of an inductor pack 80 in accordance with an embodiment of the present invention. The inductor pack 80 may serve as the inductor pack 206 in FIG. 2. As shown in FIG. 8, the inductor pack 80 comprises: a magnetic core 801 having two passageways 801-1 and 801-2 passing through the magnetic core 801 from a top surface 801-3 to a bottom surface 801-4 of the magnetic core 801, and wherein the two passageways are symmetrically located on two sides of a central axis "D" from a top view of the symmetrical magnetic core 801; and two windings 802-1 and 802-2 respectively passing through the two passageways 801-1 and 801-2.

In the embodiment of FIG. 8, the passageways 801-1 and 801-2 have a depth along an axis B perpendicular to the bottom PCB 201 and the top PCB 202 as shown in FIG. 2 if adopted by the power supply module 20.

In the embodiment of FIG. 8, the winding 802-1 and the winding 802-2 are straight and have bar structure.

In the embodiment of FIG. 8, each one of metal layers 803-1, 803-2, 805-1 and 805-2 has C-shape, lying against and wrapping the magnetic core 801 partially. The metal layers 803-1, 803-2, 805-1 and 805-2 are configured to solder the top PCB 202 to the bottom PCB 201. The ends of the metal layers 803-1, 803-2, 805-1 and 805-2 are bent 90 degrees and are extended to produce tabs to be soldered to the bottom PCB 201 and the top PCB 202 with minimized PCB trace impedance inside the bottom PCBs. In one embodiment, the metal layers 803-1 and 803-2 are for soldering the power pins (refer to the pins receiving the input voltage Vin in FIG. 1) of the power device chips 203 via the top PCB 202 to the bottom PCB 201 or to the mainboard directly with minimized PCB trace impedance. In one embodiment, the metal layers 805-1 and 805-2 are for soldering the ground reference pins of the power device chips 203 via the top PCB 202 to the bottom PCB 201 or to the mainboard directly with minimized PCB trace impedance. In the embodiment of FIG. 8, the middle of each one of the ends of the metal layers 803-1 and 803-2 are etched away, with two tabs left over, and accordingly, each one of the ends of the metal layers 805-1 and 805-2 is tailored to be placed in the middle of the corresponding two tabs of the ends of the metal layers 803-1 and 803-2 as shown in FIG. 8. As shown in FIG. 8, the metal layers 803-1 and 805-1 cover one side surface of the magnetic core 801 and lie against each other with an isolation layer 804-1 in between to avoid the electrical contact of the two metal layers. Meanwhile, the metal layers 803-2 and 805-2 cover an opposite side surface of the magnetic core 801 and lie against each other with an isolation layer 804-2 in between to avoid the electrical contact of the two metal layers. The ends of the metal layers 803-1, 803-2, 805-1 and 805-2 are bent 90 degrees and extended to have large enough area to minimize trace impedance on PCBs, and the metal layers are also wide enough to minimize the self-impedance.

It should be understood that in some embodiments, the metal layers 803-1 and 803-2 could be connected to the ground reference pin of the power devices 203 via the top PCB 202, and the metal layers 805-1 and 805-2 could be connected to the power pins of the power devices 203 via the top PCB 202. That is to say, the potentials that the metal layers 803-1, 803-2 and the metal layers 805-1, 805-2 are connected could be swapped without departing from the spirit and the scope of the present invention.

Figure 9:
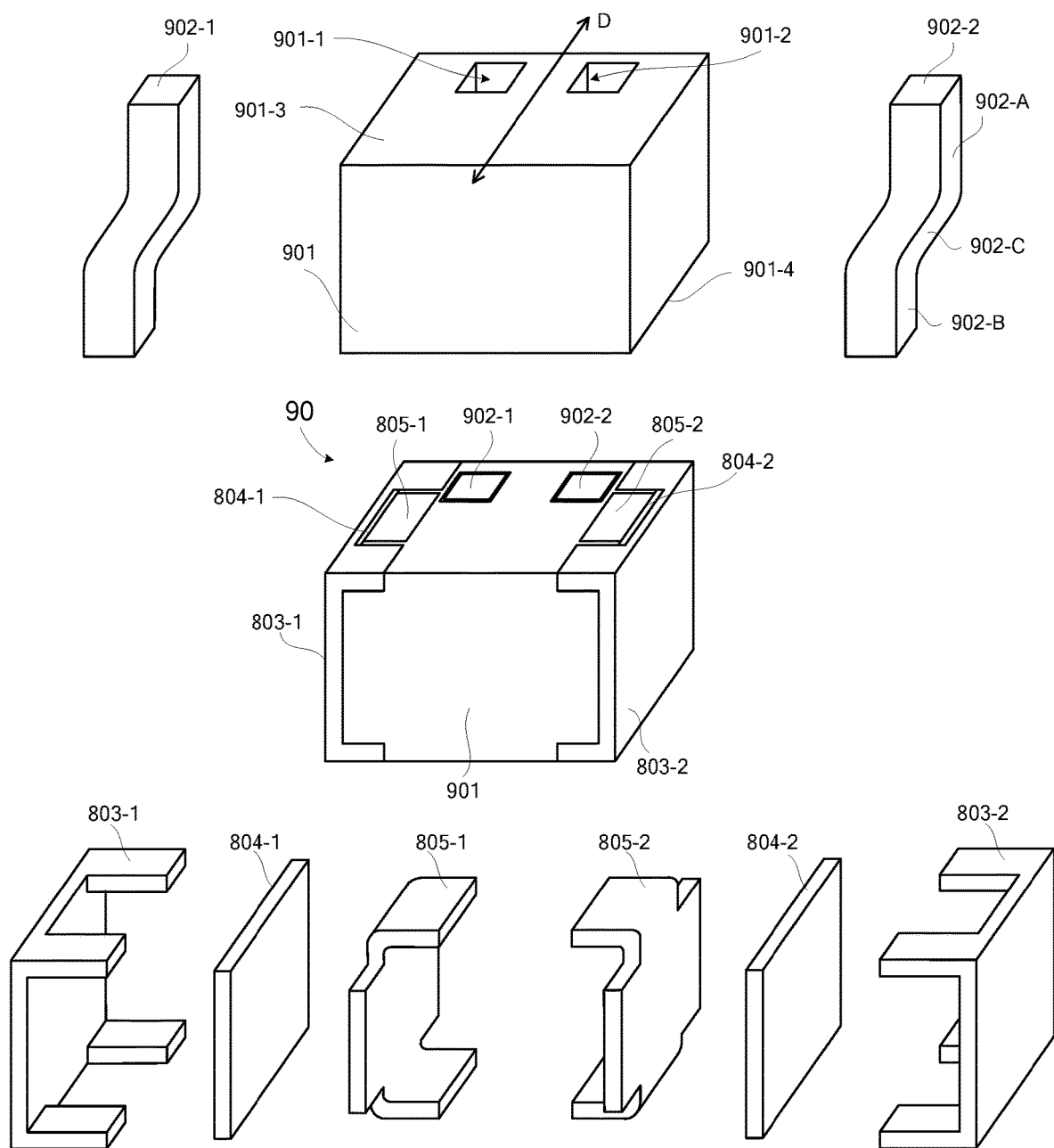
FIG. 9 shows the disassemble view of an inductor pack 90 in accordance with an embodiment of the present invention.

FIG. 9 shows the disassembled view of an inductor pack 90 in accordance with an embodiment of the present invention. The inductor pack 90 may serve as the inductor pack 206 in FIG. 2. The inductor pack 90 is similar with the inductor pack 80 in FIG. 8. The difference is that in FIG. 9, the windings 902-1 and 902-2 are not as straight as windings 802-1 and 802-2 in FIG. 8. In FIG. 9, each one of the windings 902-1 and 902-2 comprises three sections 902-A, 902-B and 902-C, wherein the first section 902-A is extended from a top surface 901-3 of a magnetic core 901 and has a length perpendicular to the top surface 901-3, the second section 902-B is extended from a bottom surface 901-4 of the magnetic core 901 and has a length perpendicular to the bottom surface 901-4, and the third section 902-C connects the first section 902-A and the second section 902-B. In one embodiment, the third section 902-C has a length parallel to the top surface 901-3 and the bottom surface 901-4.

Figure 10:
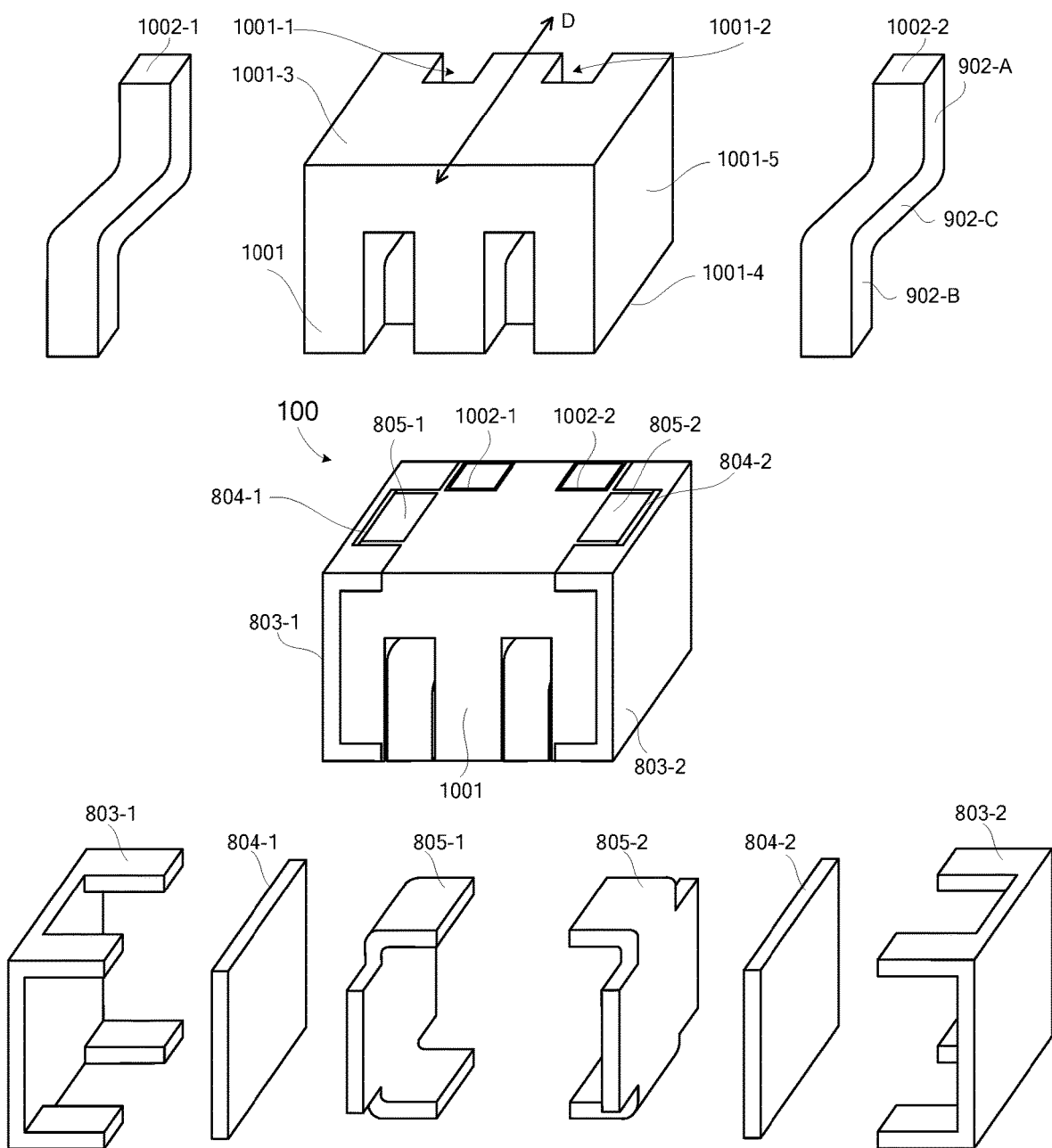
FIG. 10 shows the disassembled view of an inductor pack 100 in accordance with an embodiment of the present invention.

FIG. 10 shows the disassembled view of an inductor pack 100 in accordance with an embodiment of the present invention. The inductor pack 100 may serve as the inductor pack 206 in FIG. 2. The inductor pack 100 is similar with the inductor pack 90 in FIG. 9. The difference is that in FIG. 10, the third section 1002-C of each winding is long enough to expose the first section 1002-A and the second section 1002-B at the associated side surfaces 1001-5 of the magnetic core 1001, wherein the exposed surfaces of the windings 1002-1 and 1002-2 are aligned to the associated side surfaces of the magnetic core 1001 to make the inductor pack 100 have planar surfaces.

Figure 11:
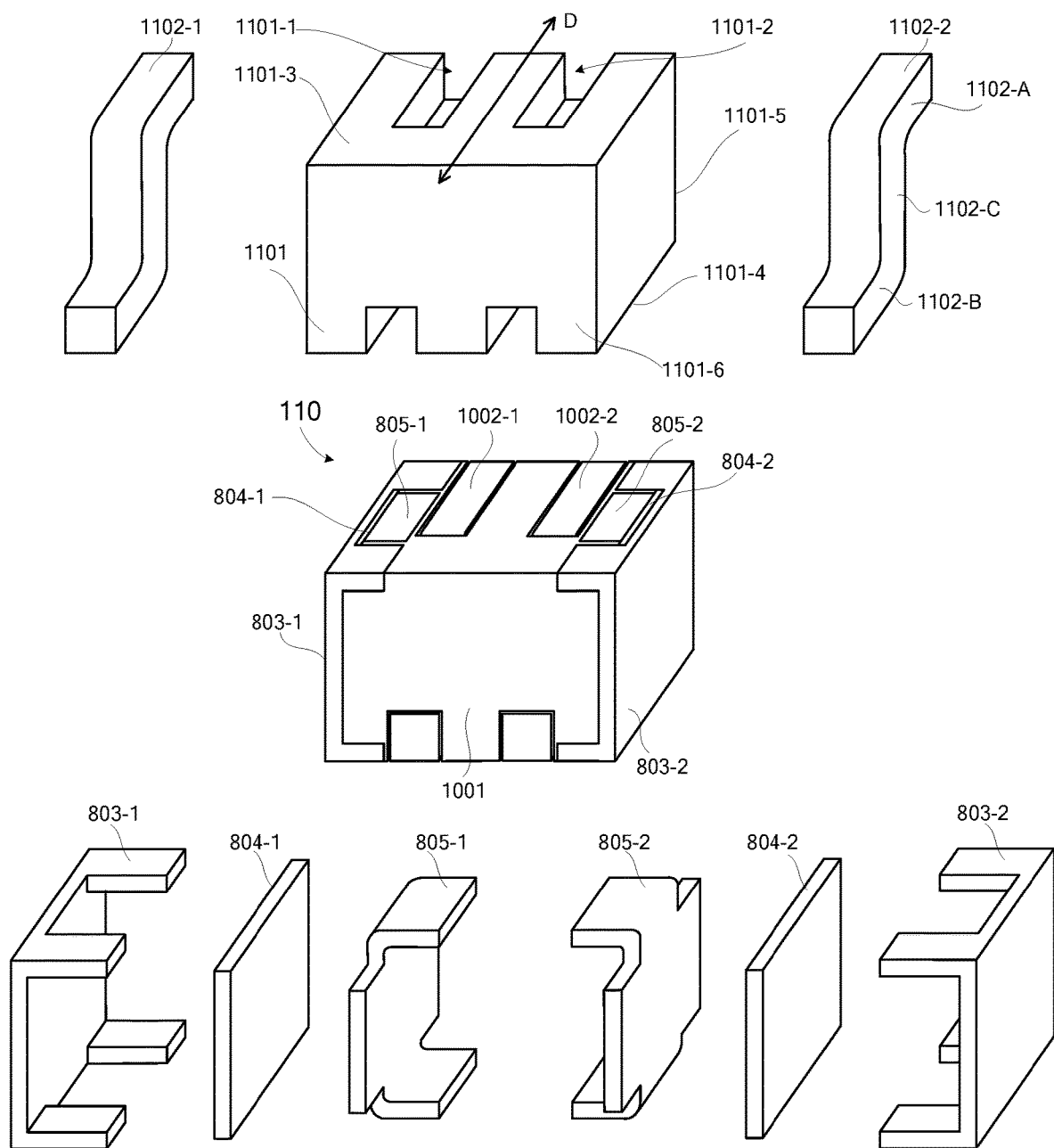
FIG. 11 shows the disassemble view of an inductor pack 110 in accordance with an embodiment of the present invention.

FIG. 11 shows the disassembled view of an inductor pack 110 in accordance with an embodiment of the present invention. The inductor pack 110 may serve as the inductor pack 206 in FIG. 2. The inductor pack 110 is similar with the inductor pack 100 in FIG. 10. The difference is that in FIG. 11, each one of the windings 1102-1 and 1102-2 comprises three sections 1102-A, 1102-B and 1102-C, wherein the first section 1102-A is extended from one of the side surfaces 1101-5 of a magnetic core 1101 and has a length parallel to the top surface 1101-3, the second section 1102-B is extended from an opposite side surface 1101-6 of the magnetic core 1101 and has a length parallel to the bottom surface 1101-4, and the third section 1102-C connects the first section 1102-A and the second section 1102-B. The first section 1102-A is exposed at the top surface 1101-3 and the exposed surface is aligned to the top surface 1101-3 to make the top surface 1101-3 planar. The second section 1102-B is exposed at the bottom surface 1101-4 of the magnetic core 1101, and the exposed surface is aligned to the bottom surface 1101-4 to make the bottom surface 1101-4 planar. In one embodiment, the third section 1102-C has a length perpendicular to the top surface 1101-3 and the bottom surface 1101-4.

Figure 12:
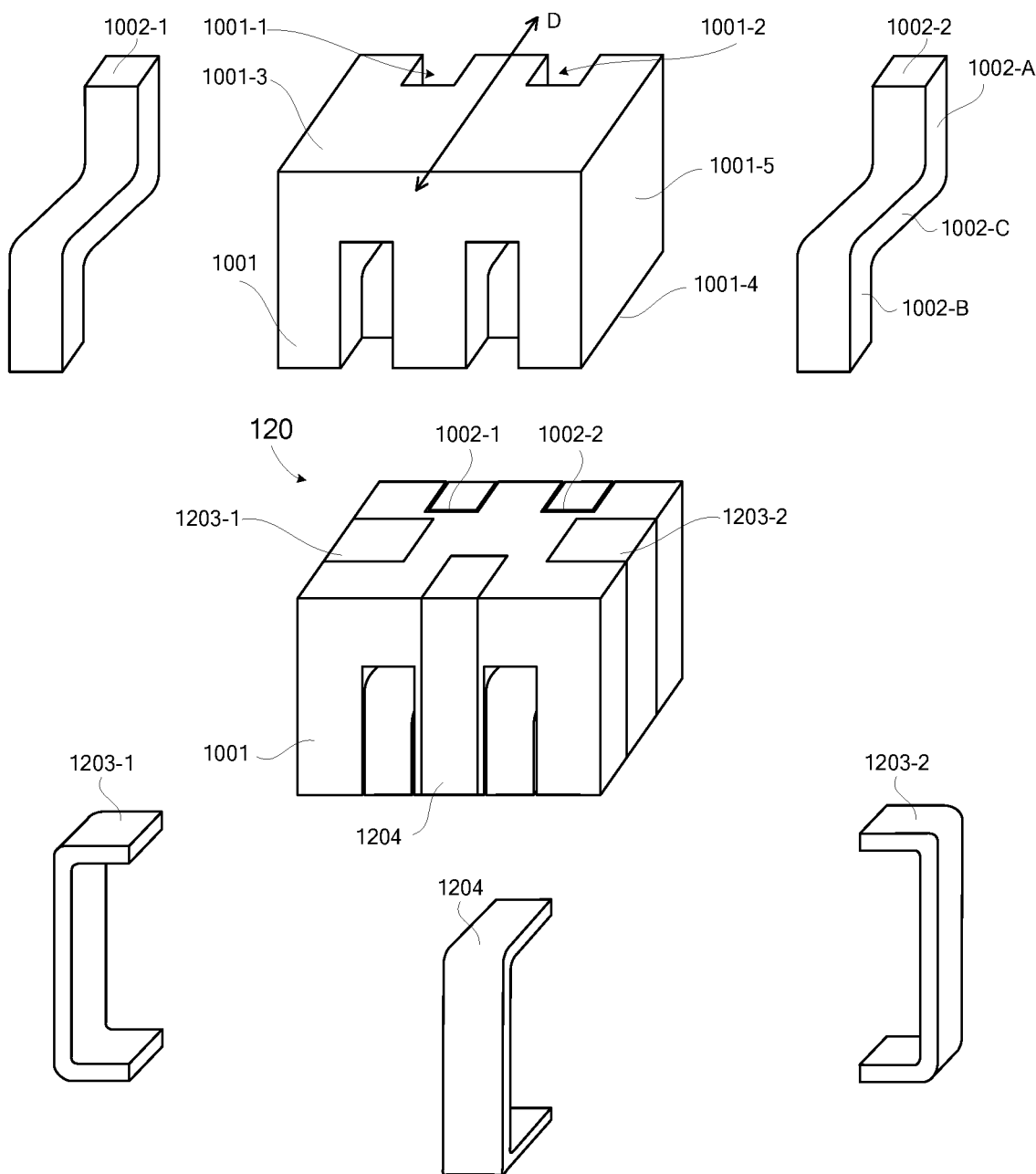
FIG. 12 shows the disassemble view of an inductor pack 120 in accordance with an embodiment of the present invention.

FIG. 12 shows the disassembled view of an inductor pack 120 in accordance with an embodiment of the present invention. The inductor pack 120 may serve as the inductor pack 206 in FIG. 2. The inductor pack 120 is similar with the inductor pack 100 in FIG. 10. The difference is that the metal layers 1203-1, 1203-2 and 1204 are not overlapped in FIG. 12. In FIG. 12, the metal layers 1203-1 and 1203-2 lie against two opposite side surfaces of the magnetic core 1001, and the metal layer 1204 lies against one of the remaining side surfaces, wherein each one of the metal layers 1203-1, 1203-2 and 1204 has C-shape, and has a first end bent 90 degree to cover part of a top surface 1001-3 of a magnetic core 1001, and a second end bent 90 degree to cover part of a bottom surface 1001-4 of the magnetic core 1001.

In the embodiment of FIG. 12, the metal layers 1203-1 and 1203-2 are connected to a first potential while the metal layer 1204 is connected to a second potential. For example, the first potential could be the voltage at the ground reference pin of the power devices 203, and the second potential could be the voltage at the power pins of the power devices 203, vice versa.

Figure 13:
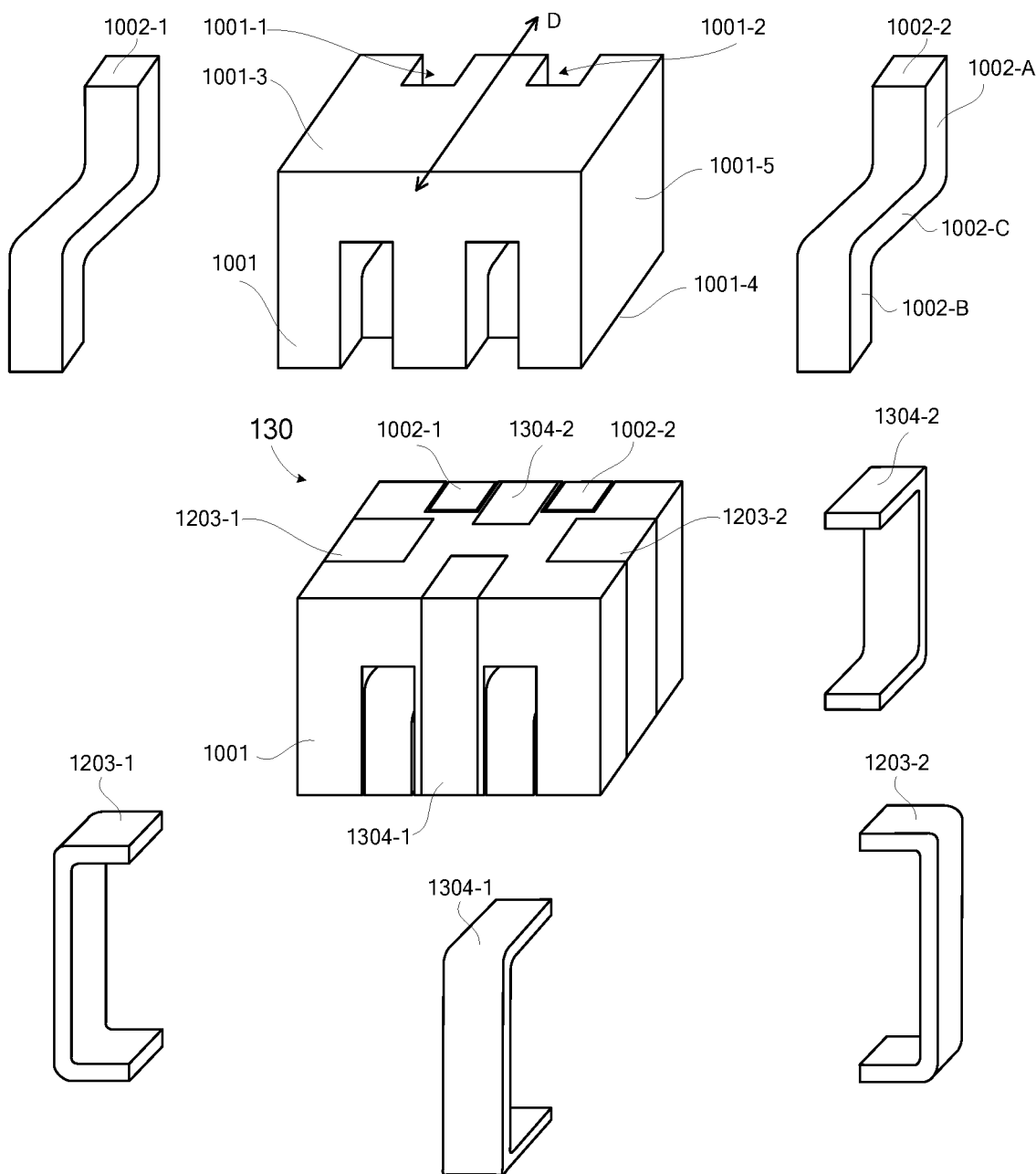
FIG. 13 shows the disassembled view of an inductor pack 130 in accordance with an embodiment of the present invention.

FIG. 13 shows the disassembled view of an inductor pack 130 in accordance with an embodiment of the present invention. The inductor pack 130 may serve as the inductor pack 206 in FIG. 2. The inductor pack 130 is similar with the inductor pack 120 in FIG. 12. The difference is that the inductor pack 130 comprises more metal layers, i.e., the inductor pack 130 comprises the metal layers 1203-1, 1203-2, 1304-1 and 1304-2. In FIG. 13, the metal layers 1203-1 and 1203-2 lie against two opposite side surfaces, and the metal layers 1304-1 and 1304-2 lies against the other two opposite side surfaces, wherein the metal layers 1203-1 and 1203-2 are connected to the first potential, and the metal layers 1304-1 and 1304-2 are connected to the second potential. Similar with the metal layers in FIG. 12, each one of the metal layers 1203-1, 1203-2, 1304-1 and 1304-2 has C-shape, and has a first end bent 90 degree to cover part of the top surface 1001-3 of the magnetic core 1001, and a second end bent 90 degree to cover part of the bottom surface 1001-4 of the magnetic core 1001. More metal layers provide more flexibility to the pad distribution of the top PCB 202 and the bottom PCB 201, or the mainboard that the power supply module attached to.

The metal layers in the different embodiments may have different patterns to wrap the magnetic cores in the present invention. Also, when the shapes of the magnetic cores change, the patterns of the metal layers changed accordingly. It should be understood that all the metal layers and all the windings are spaced away to avoid electrical contact, i.e., avoid short circuit.

In some embodiments, some or all of the metal layers in FIGS. 8-13 may have other shapes, e.g., L-shape, having one of the ends extended to cover the top surface or the bottom surface of the magnetic core, like the metal layers 305-1 and 305-2 in FIG. 3. In some embodiments, some or all of the metal layers in FIGS. 8-13 maybe a planar, with no ends bent. Furthermore, in some embodiments, metal layers with different patterns may be composed together with isolation layer in between.

In the present invention, the windings pass through the associated passageways inside the magnetic core, which means the passageways have the consistent shapes with the windings. In some embodiments, the windings are shaped firstly, and then proper material are molded to wrap the windings to form the magnetic core.

In some embodiments of the present invention, the magnetic cores are coated by epoxy resin to electrically insulate the magnetic cores from the metal layers wrapping the magnetic cores.

In the present invention, to make the inductor packs have planar surfaces, part of the windings and the metal layers that cover the surfaces of the magnetic cores are damascened into the magnetic core surfaces as shown in the inductor packs in FIGS. 3, 4 and 8-13.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A sandwich structure power supply module, comprising:
   an inductor pack having a magnetic core and at least one inductor having at least one winding;
   a top PCB (Printed Circuit Board) on top of the inductor pack; and
   at least one power device chip on top of the top PCB, wherein each one of the at least one power device chip has at least one pin connected to an associated inductor of the inductor pack via the top PCB; wherein
   the inductor pack is wrapped with a plurality of metal layers, wherein a first metal layer of the plurality of metal layers is electrically connected to a first potential, a second metal layer of the plurality of metal layers is electrically connected to a second potential, each of the first metal layer and the second metal layer covers a first side surface of the magnetic core with an isolation layer in between, and a first end of the first metal layer is bent and extended along a top surface of the magnetic core to form two tabs, and a first end of the second metal layer is bent and extended along the top surface of the magnetic core between the two tabs.

2. The sandwich structure power supply module of claim 1, further comprising:
   a bottom PCB, at a bottom of the sandwich structure power supply module; and
   a connector, connected between the bottom PCB and the top PCB, wherein the connector has a plurality of metal pillars respectively connecting solder pads on the bottom PCB to solder pads on the top PCB.

3. The sandwich structure power supply module of claim 1, wherein at least one metal layer has C-shape, with a first end bent and extended along a top surface of the inductor pack, and a second end bent and extended along a bottom surface of the inductor pack.

4. The sandwich structure power supply module of claim 1, wherein the inductor pack comprises:
   the at least one winding of the at least one inductor passing through the magnetic core.

5. The sandwich structure power supply module of claim 4, wherein the at least one winding is straight.

* * * * *